(12) United States Patent
Monferrer

(10) Patent No.: US 10,338,197 B2
(45) Date of Patent: Jul. 2, 2019

(54) SYSTEM AND METHOD FOR USE OF QUALITATIVE MODELING FOR SIGNAL ANALYSIS

(71) Applicant: Accenture Global Solutions Limited, Dublin (IE)

(72) Inventor: Maria Teresa Escrig Monferrer, McKenna, WA (US)

(73) Assignee: Accenture Global Solutions Limited, Dublin (IE)

( * ) Notice: Subject to any disclaimer, the term of this patent is extended or adjusted under 35 U.S.C. 154(b) by 262 days.

(21) Appl. No.: 15/141,818

(22) Filed: Apr. 28, 2016

(65) Prior Publication Data

US 2017/0315212 A1    Nov. 2, 2017

(51) Int. Cl.
| G01S 7/35 | (2006.01) |
| G01S 7/292 | (2006.01) |
| G01S 7/527 | (2006.01) |
| G01S 7/536 | (2006.01) |
| H03M 7/30 | (2006.01) |

(52) U.S. Cl.
CPC ............ *G01S 7/2923* (2013.01); *G01S 7/292* (2013.01); *G01S 7/354* (2013.01); *G01S 7/5273* (2013.01); *G01S 7/536* (2013.01); *H03M 7/30* (2013.01); *H03M 7/3068* (2013.01)

(58) Field of Classification Search
CPC .......................... A61B 5/0456; G01N 30/8624
See application file for complete search history.

(56) References Cited

U.S. PATENT DOCUMENTS

| 2008/0146940 A1* | 6/2008 | Jenkins | A61B 8/08 |
| | | | 600/463 |
| 2013/0066211 A1* | 3/2013 | Konofagou | A61B 8/08 |
| | | | 600/450 |

* cited by examiner

*Primary Examiner* — Charles D Garber
*Assistant Examiner* — Alia Sabur
(74) *Attorney, Agent, or Firm* — Fish & Richardson P.C.

(57) ABSTRACT

A system and method for qualitative analysis of time progressive signals, comprising: a qualitative signal analysis module, comprising at least a processor, a memory, and a long term storage device; and an output processor module comprising at least a processor a memory and a network interface has been devised. The qualitative signal analysis module retrieves signal data over time and applies preprogrammed protocols to compare multiple aspects of the signal data to derive meaningful data. The output processor module encodes data generated by the qualitative signal analysis module for use in subsequent analytical steps such as further manipulation, classification or long term storage.

20 Claims, 12 Drawing Sheets

Fig. 2
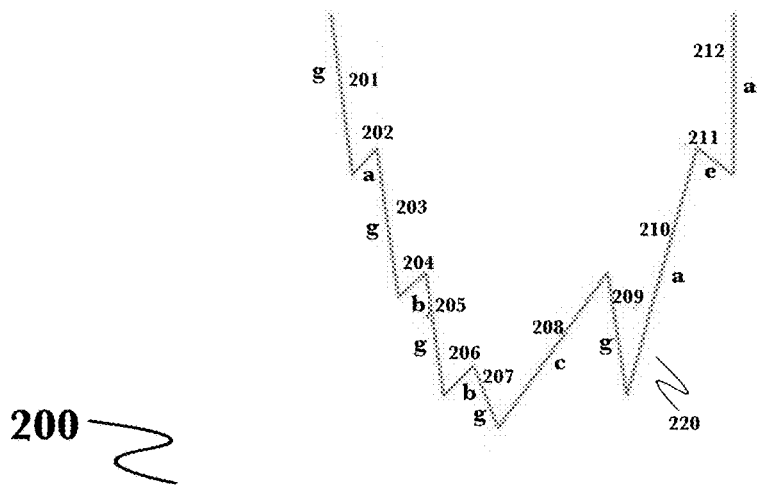
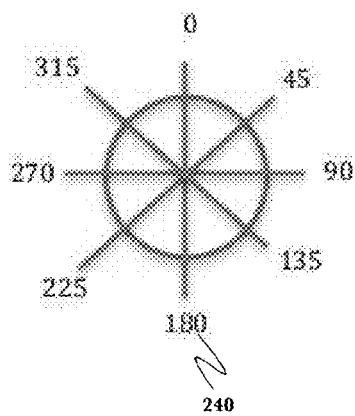

Fig.3
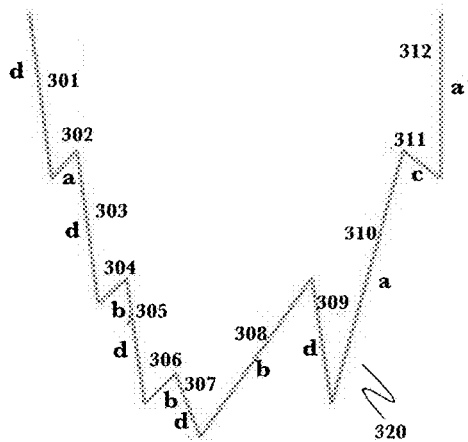
300
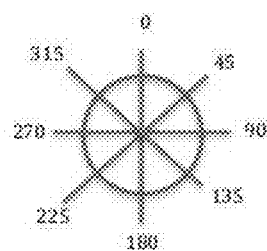
| Qualitative tag | Icon | Angle description |
|---|---|---|
| a | | 0<X<=45 |
| b | | 45<X<=90 |
| c | | 90<X<=135 |
| d | | 135<X<180 |
330
340
| 301a | 302a | 303a | 304a | 305a | 306a | 307a | 308a | 309a | 310a | 311a | 312a |
|---|---|---|---|---|---|---|---|---|---|---|---|
| 1 | 2 | 3 | 4 | 5 | 6 | 7 | 8 | 9 | 10 | 11 | 12 |
| d | a | d | b | d | b | d | b | d | a | c | a |
350

SYSTEM AND METHOD FOR USE OF QUALITATIVE MODELING FOR SIGNAL ANALYSIS

CROSS-REFERENCE TO RELATED APPLICATIONS

None.

BACKGROUND OF THE INVENTION

Field of the Art

The disclosure relates to the field of analysis of time progression signal data, more specifically particularly to the field of qualitative analysis of time progressive signal data possibly with high noise to signal ratios.

Discussion of the State of the Art

Signal processing techniques have been in use for centuries, using methods as simple as climbing hills to more clearly send sound smoke or light signals to, processing radio signal bounced off of objects to detect approaching objects. Today, signal processing techniques are crucial in many fields including sound signal processing, speech recognition, wireless communication, medical monitoring and diagnostic equipment, control systems, financial transactions, navigation, and real time signal quality improvement procedures, just to list a few examples.

"Signal processing" can be divided into a few broad substeps: 1—Converting an analog signal into a digital signal, which is not always needed; 2—Filtering the raw signal to separate background "noise" from the intended information contained in the signal; 3—Signal analysis to both identify noise from signal and to interpret the data content of the signal; and 4—A classification process to identify the meaning of each part of the signal. To date the vast majority of the signal analysis substep has been based on methods and techniques that employ statistical, probabilistic or numeric, quantitative, analysis of the incoming signal to obtain its main characteristics and to interpret it. Unfortunately, when the incoming signal is below a certain threshold of stability, varies in volume from time to time, or when the signal to noise ratio drops below a certain threshold, quantitative (numeric, probabilistic and statistical) become ineffective to recover the information stored in the signal.

What is needed is a system that substitutes numerical, quantitative analysis, with a system of qualitative descriptors such as depth or diameter to describe the parts of a signal under analysis so as to replace or augment quantitative analysis, especially in circumstances such as those outlined above where quantitative analysis does not perform well.

SUMMARY OF THE INVENTION

Accordingly, the inventor has conceived and reduced to practice, in a preferred embodiment of the invention, a system and method for use of qualitative modeling for signal analysis of signals from a large plurality of sources.

According to a preferred embodiment of the invention, a system for qualitative analysis of time progressive signals, comprising: a qualitative signal analysis module, comprising at least a processor, a memory, and a long term storage device; and an output processor module comprising at least a processor a memory and a network interface. The qualitative signal analysis module retrieves signal data over time and applies pre-programmed protocols to compare multiple aspects of the signal data to derive meaningful data. The output processor module encodes data generated by the qualitative signal analysis module for use in subsequent analytical steps such as further manipulation, classification or long term storage.

According to another embodiment of the invention, qualitative signal analysis module analyzes a subset of signal data for angles that make up its peaks. The qualitative signal analysis module analyzes a subset of the signal data for relative length of the segments and (optionally) qualitative angles making up its peaks. The qualitative signal analysis module may also analyze a subset of signal data analyzed for length of segments between its peaks. The qualitative signal analysis module analyzes a subset of signal data to compare similitude between two or more peaks. Analysis results from qualitative signal analysis module may allow excision of a subset of signal data, which lack a preprogrammed level of meaningful information prior to possible further classification or storage of that signal data. A portion of the signal data may be compressed based upon results from qualitative signal analysis module related to similitude between peaks and valleys.

According to another preferred embodiment of the invention, a method for qualitative analysis of time progressive signals, the method comprising the steps of: (a) retrieving time progressive signal data using a qualitative signal analysis module comprising at least a processor, a memory, and a long term storage device; (b) upon retrieving the time progressive signal data, by the qualitative signal analysis module, applying pre-programmed protocols to compare multiple aspects of the signal data to derive meaningful data and (c) encode the data resultant from the qualitative signal analysis module using an output processor module comprising at least a processor a memory and a network interface, for use in subsequent analytical steps such as further manipulation, classification or long term storage.

According to another embodiment of the invention, the method is modified in that the qualitative signal analysis module analyzes a subset of the signal data for angles that make up its valleys and peaks. In a further embodiment, the method is modified in that the qualitative signal analysis module analyzes a subset of the signal data for length of the segments making up its valleys and peaks. In another embodiment, the method is modified in that the qualitative signal analysis module analyzes a subset of signal data analyzed for length of segments between its valley and peaks. In a further variation of the method, the qualitative signal analysis module analyzes a subset of signal data to compare similitude between two or more peaks or valleys. In yet a further variation of the method, analysis results from qualitative signal analysis module may allow excision of a subset of signal data which lack a preprogrammed level of meaningful information prior to possible further classification or storage of that signal data. In another variant of the method, a portion of the signal data may be compressed based upon results from qualitative signal analysis module related to similitude between peaks and valleys.

BRIEF DESCRIPTION OF THE DRAWING FIGURES

The accompanying drawings illustrate several embodiments of the invention and, together with the description, serve to explain the principles of the invention according to the embodiments. It will be appreciated by one skilled in the art that the particular embodiments illustrated in the drawings are merely exemplary, and are not to be considered as limiting of the scope of the invention or the claims herein in any way.

FIG. 2 is a method diagram depicting how signal peak segment angles may be assigned into seven categories.

FIG. 3 is a method diagram depicting how signal peak segment angles may be assigned into four categories.

DETAILED DESCRIPTION

Figure 1:
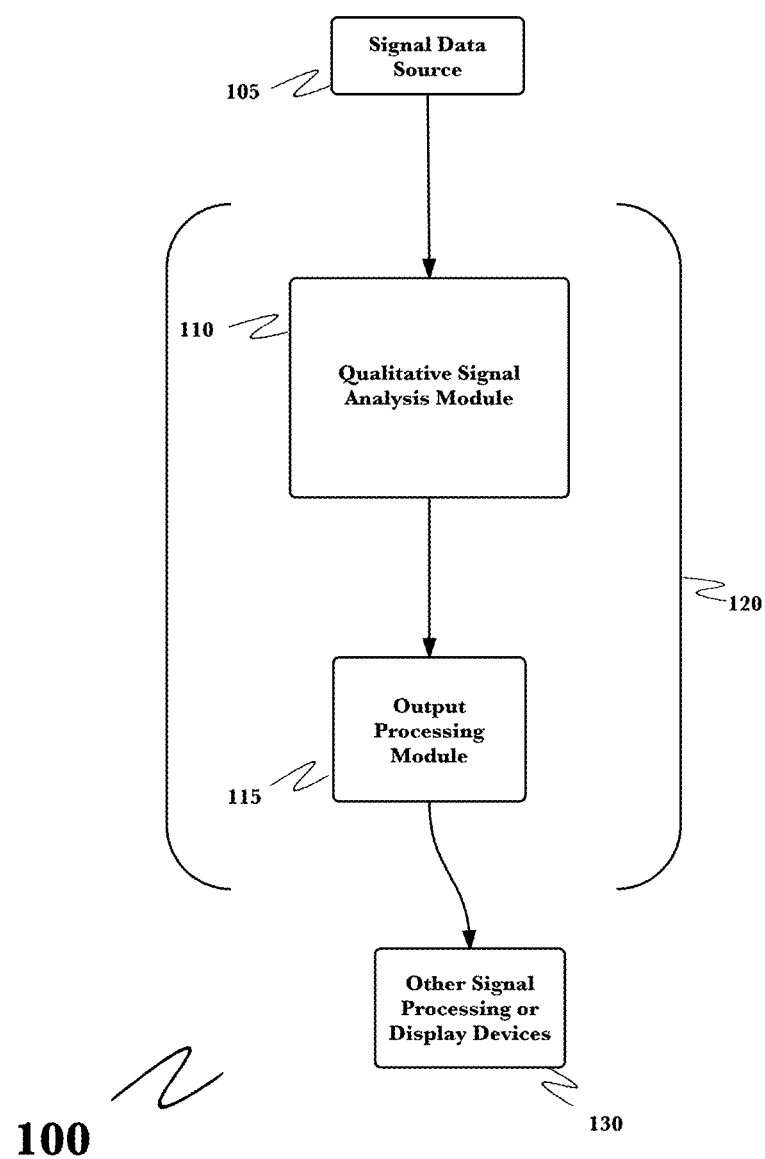
FIG. 1 is an architecture diagram of a system for qualitative signal analysis.

The inventor has conceived, and reduced to practice, in a preferred embodiment of the invention, a system and method for use of qualitative modeling for signal analysis.

One or more different inventions may be described in the present application. Further, for one or more of the inventions described herein, numerous alternative embodiments may be described; it should be appreciated that these are presented for illustrative purposes only and are not limiting of the inventions contained herein or the claims presented herein in any way. One or more of the inventions may be widely applicable to numerous embodiments, as may be readily apparent from the disclosure. In general, embodiments are described in sufficient detail to enable those skilled in the art to practice one or more of the inventions, and it should be appreciated that other embodiments may be utilized and that structural, logical, software, electrical and other changes may be made without departing from the scope of the particular inventions. Accordingly, one skilled in the art will recognize that one or more of the inventions may be practiced with various modifications and alterations. Particular features of one or more of the inventions described herein may be described with reference to one or more particular embodiments or figures that form a part of the present disclosure, and in which are shown, by way of illustration, specific embodiments of one or more of the inventions. It should be appreciated, however, that such features are not limited to usage in the one or more particular embodiments or figures with reference to which they are described. The present disclosure is neither a literal description of all embodiments of one or more of the inventions nor a listing of features of one or more of the inventions that must be present in all embodiments.

Headings of sections provided in this patent application and the title of this patent application are for convenience only, and are not to be taken as limiting the disclosure in any way.

Devices that are in communication with each other need not be in continuous communication with each other, unless expressly specified otherwise. In addition, devices that are in communication with each other may communicate directly or indirectly through one or more communication means or intermediaries, logical or physical.

A description of an embodiment with several components in communication with each other does not imply that all such components are required. To the contrary, a variety of optional components may be described to illustrate a wide variety of possible embodiments of one or more of the inventions and in order to more fully illustrate one or more aspects of the inventions. Similarly, although process steps, method steps, algorithms or the like may be described in a sequential order, such processes, methods and algorithms may generally be configured to work in alternate orders, unless specifically stated to the contrary. In other words, any sequence or order of steps that may be described in this patent application does not, in and of itself, indicate a requirement that the steps be performed in that order. The steps of described processes may be performed in any order practical. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to one or more of the invention(s), and does not imply that the illustrated process is preferred. Also, steps are generally described once per embodiment, but this does not mean they must occur once, or that they may only occur once each time a process, method, or algorithm is carried out or executed. Some steps may be omitted in some embodiments or some occurrences, or some steps may be executed more than once in a given embodiment or occurrence.

When a single device or article is described herein, it will be readily apparent that more than one device or article may be used in place of a single device or article. Similarly, where more than one device or article is described herein, it will be readily apparent that a single device or article may be used in place of the more than one device or article.

The functionality or the features of a device may be alternatively embodied by one or more other devices that are not explicitly described as having such functionality or features. Thus, other embodiments of one or more of the inventions need not include the device itself.

Techniques and mechanisms described or referenced herein will sometimes be described in singular form for clarity. However, it should be appreciated that particular embodiments may include multiple iterations of a technique or multiple instantiations of a mechanism unless noted otherwise. Process descriptions or blocks in figures should be understood as representing modules, segments, or portions of code which include one or more executable instructions for implementing specific logical functions or steps in the process. Alternate implementations are included within the scope of embodiments of the present invention in which, for example, functions may be executed out of order from that shown or discussed, including substantially concurrently or in reverse order, depending on the functionality involved, as would be understood by those having ordinary skill in the art.

Conceptual Architecture

Figure 4:
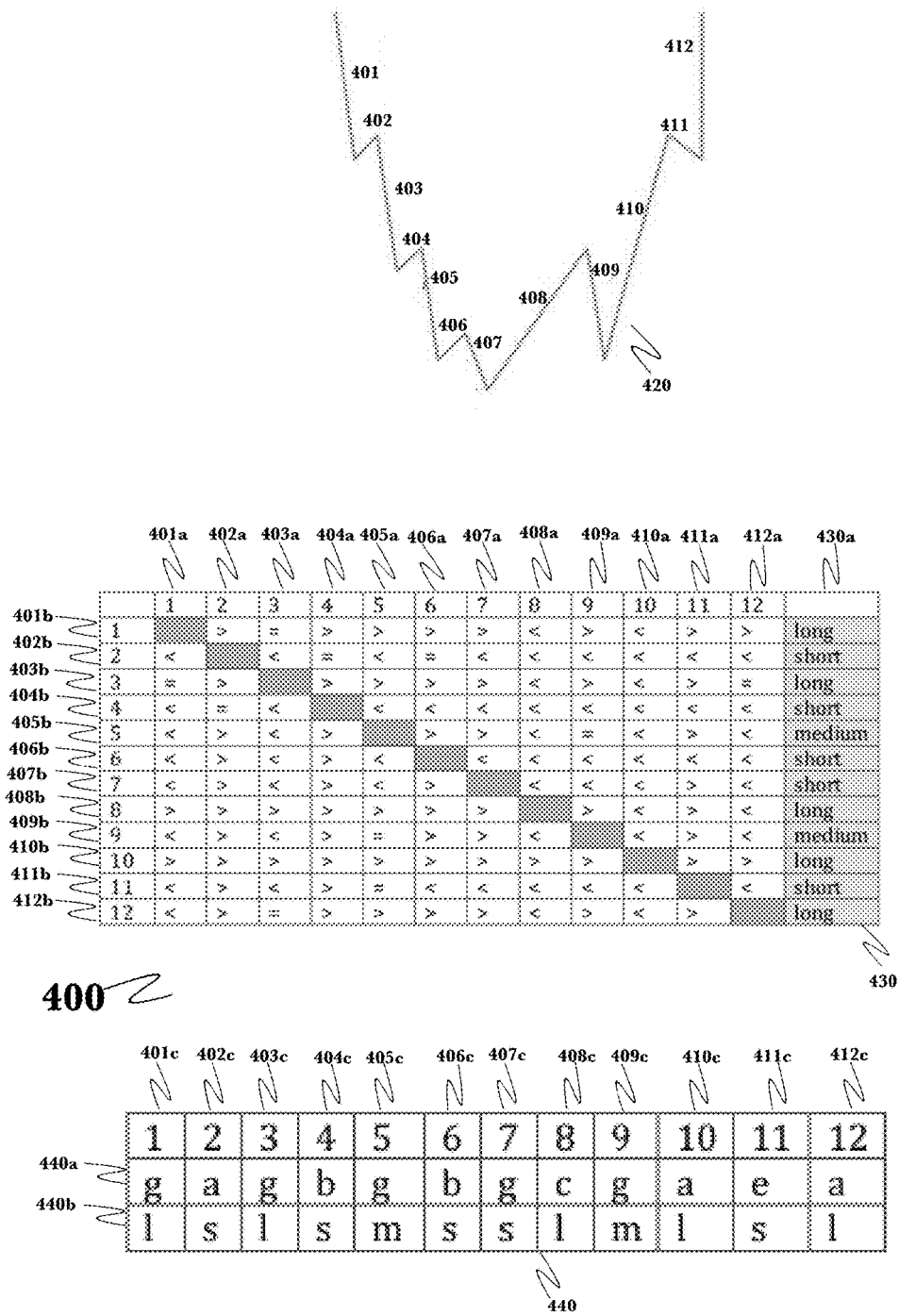
FIG. 4 is a method diagram depicting how signal peak segment lengths may be assigned.
Figure 8:
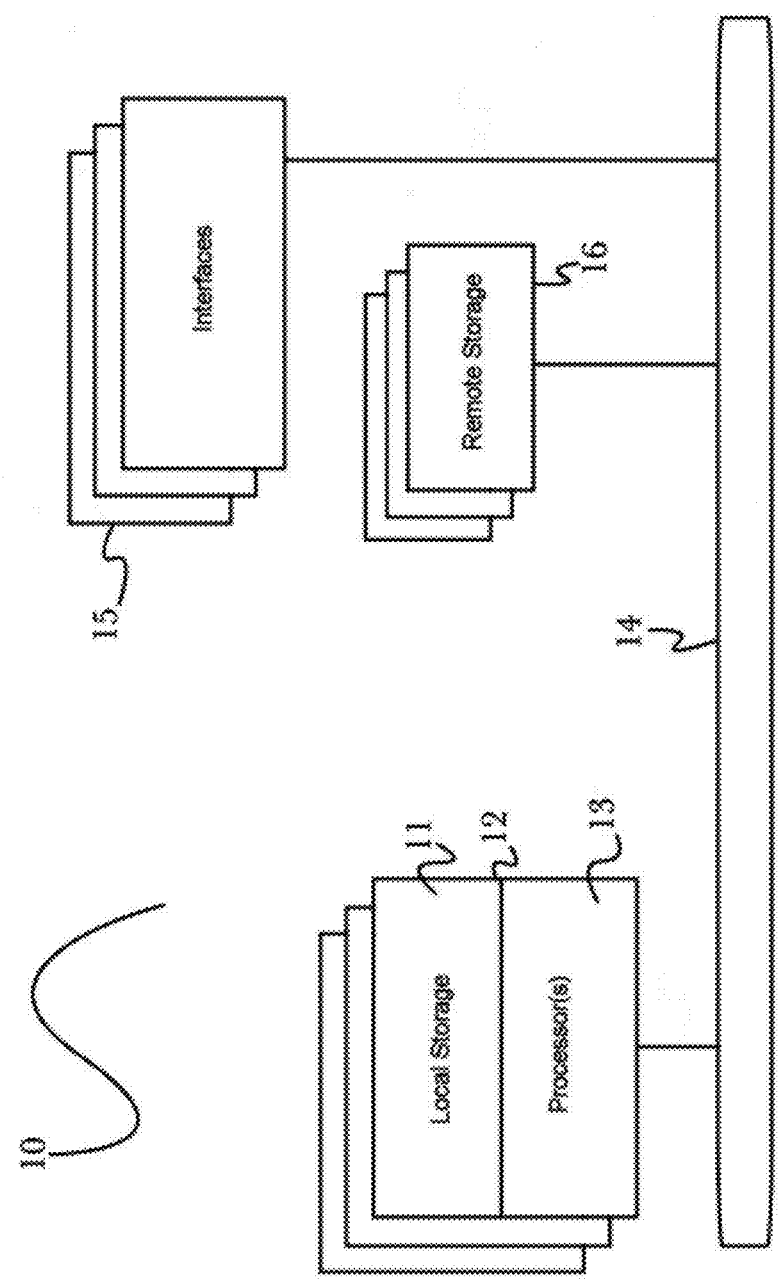
FIG. 8 is a block diagram illustrating an exemplary hardware architecture of a computing device used in an embodiment of the invention.

FIG. 1 is an architecture diagram of a system for qualitative signal analysis 100. Signals to be analyzed using the qualitative signal analysis device 120 may come from any of a large plurality of sources 105, such as SONAR signals, RADAR signals, ultrasound signals, medical monitor or diagnostic devices, biological assay readers, and media content recording, transmission or rendering equipment, just to list a very small, certainly not limiting, number of examples. These signals from a large plurality of possible sources, enter the qualitative signal analysis module which comprises specialized analysis instructions on a computing device comprising at least a processor, a memory, and a long term storage device as depicted in FIG. 8, 10. The qualitative signal analysis module may first need to convert an analog signal to its digital counterpart (not depicted) then analyzes each peak designated as of interest to the analyst for qualitative parameters such as number of segments in each peak as depicted in FIG. 2, 220, the approximate angle of each segment as depicted in FIG. 2, 230 and FIG. 3, 330 and the relative lengths of each segment as depicted in FIG. 4, 430. There are, of course other qualitative parameters that might be measured within a signal such as inter-peak distances, which would be known to those familiar with the art. The parameters presented here are felt to be some of the more important examples, but are in no way meant to be limiting or to exclusively describe the capabilities of the invention.

Figure 6:
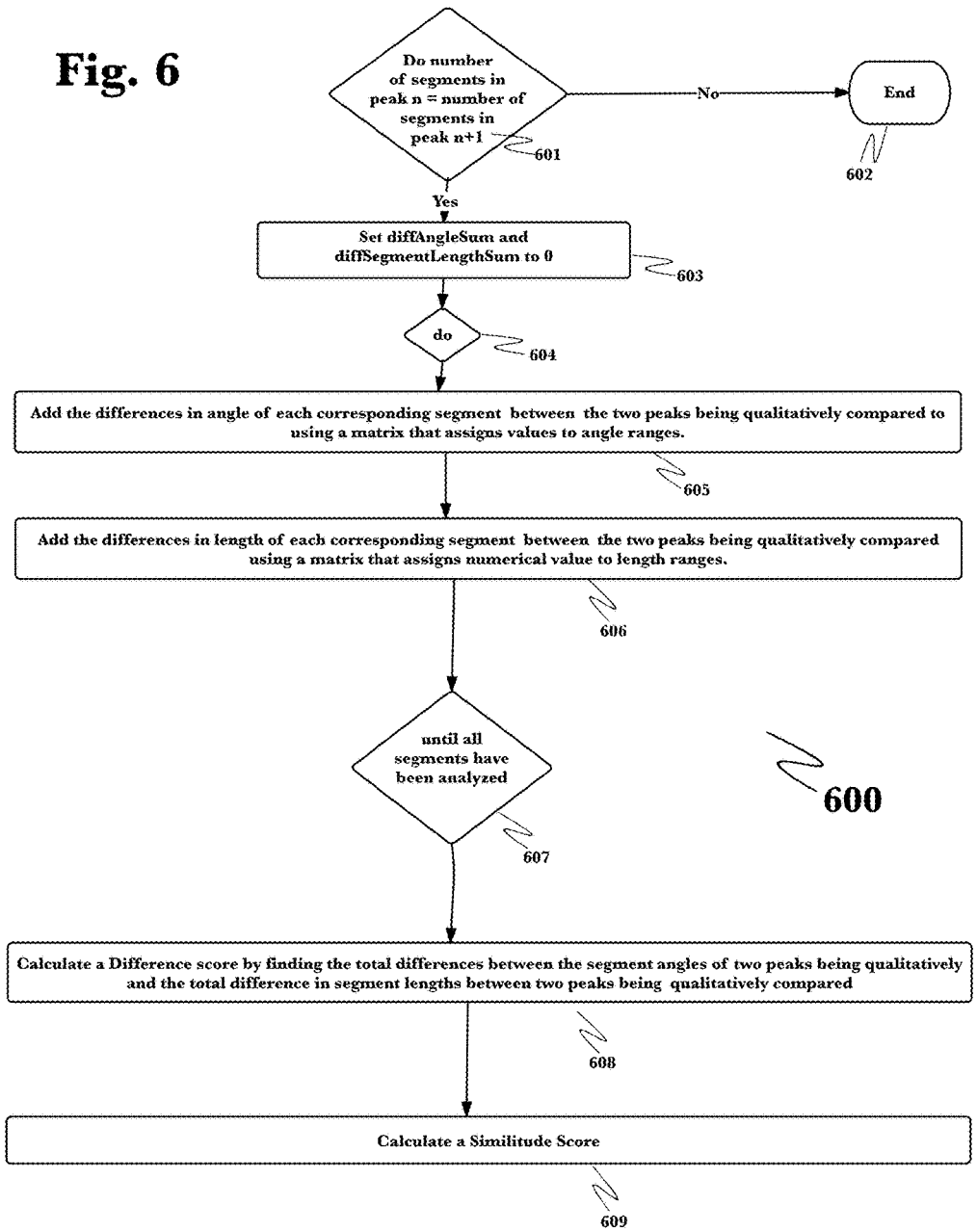
FIG. 6 is a process diagram of how similitude between two peaks with the same number of segments may be calculated.

From the measured qualitative peak analysis data described above, further information regarding the signal can be derived. One such calculated characteristic is the similitude between two peaks within the signal which may be calculated using the summed differences in the angles of similarly positioned segments in two compared peaks, and the summed differences in segment relative lengths of similarly positioned segments in two compared peaks which are then combined in a formula to give a percentage of similitude as is depicted in FIG. 6, 600. Those skilled in the art might devise other comparisons that could be calculated and the similitude example is in no way meant to limit the invention; calculating similitude, however, allows such things as peak classification, and may enable data compression to be performed as like peaks can be very efficiently marked. Similitude calculations also allow specific information to be rapidly identified in disparate samples of signal data. For example, suppose one is analyzing signal records from CAT scans of the brains of athletes for the earliest signs of concussion damage that leads to chronic traumatic encephalopathy, permanent damage, and one feels that such a computerized axial tomography scan CAT scan marker has been discovered within the overwhelming amount of data contained in the total signal, the indicative peak data being just a specific peak or group of peaks in the scans' signal data. In the small number of scan signals visually analyzed, the peak(s) are distinctively similar, but vary greatly in width and amplitude depending on equipment settings, the study subject, and extent of the damage. Qualitative signal similitude analysis is very well matched to this task as the amplitude of the signal will play little or no role due to the collection of relative segment lengths and the angles of the candidate peak remain very similar across all studied subjects. Having a representative signal peak, or set of representative signal peaks, identified, one can first use an embodiment of the invention to analyze the CAT scans of a plurality of athletes who have had concussions but never developed any signs of chronic traumatic encephalopathy, and CAT scans of a plurality of athletes who have had concussions and went on to be diagnosed with chronic traumatic encephalopathy postmortem. Assuming the best, that the signal peak(s) that were isolated are markers for the disease at an early point, one now has an identifiable qualitative signal peak that can be applied either by a qualitative signal analysis module embedded in the CAT scanner device or a qualitative signal analysis device as part of a secondary processing system to automatically identify likely disease candidates largely regardless of the extent of the injury and in the presence of a large amount of masking signal data. This CAT scan example is, of course, only one example of the use of the invention to identify signal characteristics that may vary greatly in size factors such as amplitude and where there may be a large amount of other data to obscure the data of interest. Under embodiments of the invention used in RADAR or SONAR analysis objects may be detected and identified at vastly different distances and under varying levels of background radiation (noise). In radio signal analysis such as transmission monitoring, or even SETI, the qualitative signal analysis system may be used to actively remove peaks representing known and uninteresting sources or events while augmenting signals known to be of interest while also removing background noise.

Analysis results are then passed to the output processing module 115 of the embodiment which may manipulate the format or encoding of the qualitative signal analysis data to that best suited or required by the intended receiver of those data 130. For example, direct viewing, for example, either by display on a monitor, or by printing, the analyst reviewing signal processing may need the data in tabular, numeric form, a direct pictorial representation of the data or both 130. Alternately, information related to the qualitative signal analysis results such as, but not limited to, keywords, icons, or text descriptions, triggered by the presence of a peak in the raw data may be output either exclusively or in conjunction with portions of the actual data 130. The output processing module 115 may also need to transform or specially encode data from qualitative signal analysis devices either discrete or embedded that pass that data to other systems or modules 130 such as in the CAT scan example above where the final result of finding a predictive marker signal for chronic traumatic encephalopathy may be the display of an icon, possibly at the site of the marker on the readout with size or severity information for the lesion. Other uses where the derived data is incorporated into a readout by another system or device, RADAR, SONAR, transmission monitoring, might incorporated indicative icons and size, distance or other information based on the data specifically transformed or encoded and provided to those systems by the output processing module 115. In cases where the data is stored, the output processing module 115 may compress the amount of data stored by removing all but the peaks of interest plus some surrounding portions of the original signal, as predetermined by the task design or the output processing module 115 may compress the data through use of other methods of compressing data with known repetitive features known to the art.

It should be noted that according to this embodiment of the invention, signal data would enter a qualitative signal analysis module 110, although a separate module for qualitative analysis of signals is not required for more than illustrative purposes and many other, more simplified, device embodiments comprising at least a processor, a memory, and a long term storage device as depicted in FIG. 8, 10 lacking distinct qualitative analysis module are possible.

Detailed Description of Exemplary Embodiments

Figure 7:
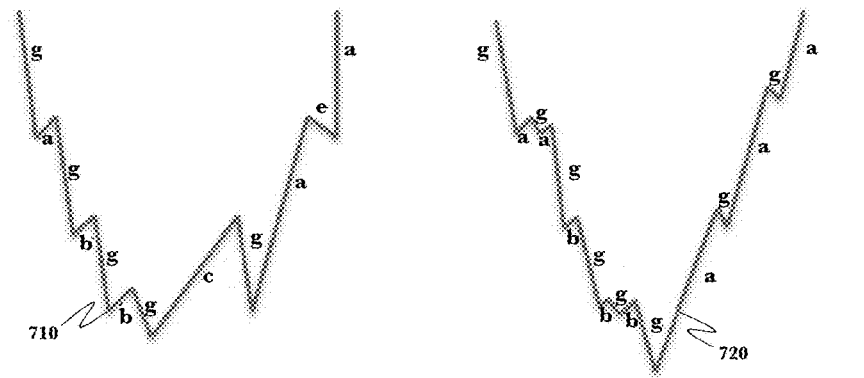
FIG. 7 is a method diagram depicting how two signal peaks with different number of segments may be normalized prior to comparison.
Figure 12:
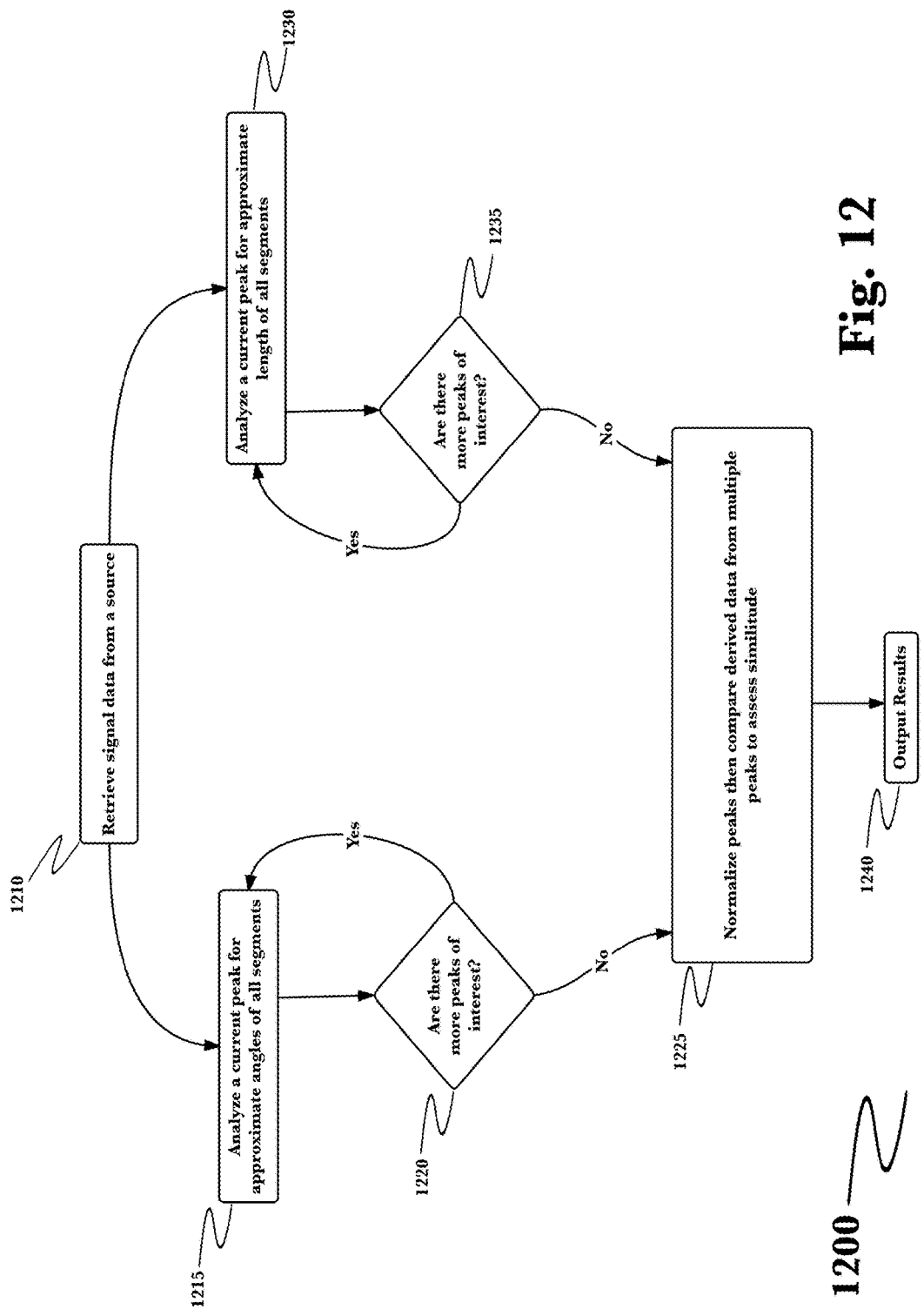
FIG. 12 is a method diagram for qualitative signal analysis.

FIG. 12 is a method diagram for qualitative signal analysis. The qualitative signal analysis device 120 may retrieve and digitize signal data from a large plurality of sources 1210 such as, medical monitoring equipment, media capture or rendering devices, network infrastructure devices, biological assay equipment, mechanical monitor and control devices and radio wave receivers and monitors. Regardless of the origin, signal peaks may be analyzed for a plurality of qualitative characteristics which include the number of line segments that make up each peak, the approximate angles of the line segments that make up each peak 1215 and the relative lengths of those line segments 1230. The accuracy of the segment angle approximations and the methods by which the lengths of the segments are dependent on the requirements of the analysis being done, the characteristics of the signal data and their assignment is described in FIG. 2, FIG. 3 and FIG. 4. These processes for segment angle and segment length can be repeated for all peaks that are of interest to an analyst processing the signal data sample 1220, 1230. Qualitative signal analysis of signal peak characteristics may allow sought for data to be extracted from signal samples too cluttered with random information ("static" or "noise") for the wanted data to be discerned by quantitative statistical, probabilistic or numeric signal analysis techniques. An additional qualitative characteristic that may be derived from segment angle and length data when multiple peaks are present is the similitude between two peaks. Prior to comparing two peaks, certain characteristics may need to be normalized. For example, peaks differing in segment number may have segments between them mapped, one method of which is depicted in FIG. 7, exacting some penalty factor, prior to similitude analysis, a process outlined in FIG. 6. Similitude between peaks in different signal samples may allow machine aided identification of previously well characterized objects, phenomena, or events, depending on the signal source, where the well characterized qualitative representation of the signal peak or peaks associated with the event, phenomenon or object can be compared to live signal data or other stored signal samples to identify those peaks and alert the signal analyst of the presence, possibly through use of a text alert or specialized icon.

The results of qualitative signal analysis are then transmitted in some way. This could be as simple as displaying or printing textual or pictorial, possibly both, representations of the results, storing the results to a data store, possibly only storing the peak data and related qualitative data of interest to the current research or compressing the signals analyzed using a method compression of repetitive data known to the art when the signal data contains many instances of peaks with the same or similar peaks. The result data may also be transformed or encoded to be transferred to another piece of equipment or device, possibly into which a qualitative signal analysis device module has been embedded to have a pre-determined effect, such as but not limited to, speeding processing of the signal as a whole, displaying specific messages, auditory signals or icons, or displaying portions of the qualitative data pertaining to the signal on that instrument.

FIG. 2 is a method diagram depicting how signal peak segment angles may be assigned into seven categories 200. An illustrative signal peak, qualitatively analyzed using seven angle categories (0° to 45°, 45°, 45° to 90°, 90°, 90° to 135°, 135°, 135° to 180°) 230 is shown 220. Seven angle categories is not an absolute choice and the choice of the number of categories will depend on the nature of the signal being analyzed and the needs of the signal processing being performed. Seven angle categories has been found to produce results with identifiable segments and sufficient informational detail for most applications encountered and therefore provides a good illustration of signal analysis requiring high angle specificity. The twelve peak segments 201, 202, 203, 204, 205, 206, 207, 208, 209, 210, 211, and 212 in 220 are labeled with the qualitative angle identifier tags (a, b, c, d, e, f, g) corresponding to the seven angle categories as depicted in 230. The compass showing reference angles 240 is included solely to better define the basis of the angles chosen. The angle category for each segment 201 through 212 are also shown in tabular form as 201a, 202a, 202a, 203a, 204a, 205a, 206a, 207a, 208a, 209a, 210a, 211a, and 212a in 250. One skilled in the art will agree that the qualitative angle identifier tags (a through g) chosen are completely arbitrary, chosen for illustrative purposes here and that any set of identifier tags called for by the signal processing application in which the qualitative signal analysis is employed are available.

FIG. 3 is a method diagram depicting how signal peak segment angles may be assigned into four categories 300. In another embodiment, an illustrative signal peak, qualitatively analyzed using four angle categories (0° to 45°, 45° to 90°, 90° to 135°, 135° to 180°) 330 is shown 320. Four angle categories is not an absolute choice and the choice of the number of categories will depend on the nature of the signal being analyzed and the needs of the signal processing being performed. Four angle categories has been found to produce results with identifiable segments and sufficient informational detail applications requiring moderate angle specificity and therefore provides a good illustration of qualitative signal analysis for such applications or in situations where high noise to signal ratios may preclude higher angle detection accuracy. The twelve peak segments 301, 302, 303, 304, 305, 306, 307, 308, 309, 310, 311, and 312 in 320 are labeled with the qualitative angle identifier tags (a, b, c, d) corresponding to the seven angle categories as depicted in 330. The compass showing reference angles 340 is included solely to better define the basis of the angles chosen. The angle category for each segment 301 through 312 are also shown in tabular form as 301a, 302a, 302a, 303a, 304a, 305a, 306a, 307a, 308a, 309a, 310a, 311a, and 312a in 350. One skilled in the art will agree that the qualitative angle identifier tags (a through d) chosen are completely arbitrary for illustrative purposes here and that any set of identifier tags called for by the signal processing application in which the qualitative signal analysis is employed are available.

In another embodiment, not depicted, the application of the qualitative signal analysis in the signal processing application may only require indication as to whether the segment is facing "up" (90° to 0° from left to right) or "down" (91° to 180° from left to right). This simpler analysis is easily accommodated within the invention.

FIG. 4 is a method diagram depicting how signal peak segment lengths may be assigned. Another qualitative signal characteristic, of the plurality available to those knowledgeable in the art, is the length of the segments that make up individual peaks. Obtaining the absolute length of each segment in a peak, while straightforward, would preclude the comparison of those lengths to other peaks in either the same signal data sample, or across signal samples unless the amplitude of both signals were identical. One method to derive segment lengths within a peak that may be used across multiple peaks and signal samples is to give each segment a length label based upon its length relative to other segments within the peak. This method is depicted here 400. The top of the figure shows the illustrative signal peak 420 used in previous figures FIG. 2, 220 and FIG. 3, 320. In the peak diagram 420 the individual peak segments are labeled 401, 402, 403, 404, 405, 406, 407, 408, 409, 410, 411, and 412. In this embodiment, relative segment length within the peak is then determined by comparing whether a particular segment, for example 401, is longer than (>in matrix 430), equal in length (=in matrix 430) or shorter than (<in matrix 430), each other segment 402, 403, 404, 405, 406, 407, 408, 409, 410, 411, and 412. The result of such an exhaustive comparison of the sample signal peak 420 is given in the matrix 430 in the middle of the FIG. 400 where each peak segment is listed on both the horizontal axis 401a through 412a and vertical axis 401b through 412b. As shown in the last column, segments are divided into three relative length categories 430a based upon whether they are found to be longer (>) than a majority threshold of other segments, in which case they are labeled as "long" 430a; whether they are of a length such that approximately one third of segments are shorter (<) than them and approximately one third longer (>) than them, in which case they are labeled as "medium" 430a; or whether they are shorter (<) than a majority threshold of other segments in which case they are labeled "short" 430a. The bottom of the FIG. 440 shows the results of the comparison matrix 430 in tabular form 440b ("l" is long, "m" is medium, "s" is short) which also shows the seven category angle results 440a described in FIG. 2.

The use of three length designations is not absolute and is chosen partially as an easy system for illustration. Other embodiments may use more designations, offering increased granularity, as dictated by the needs of the signal processing tasks and the limitations of the assay device.

In another embodiment, not depicted, comparative segment lengths may be based upon an external "seed value". For example, the "short" value may be defined as the median length of the signal noise or smaller, the "medium" segment length defined as up to 2 to 3 times the length of the short segment and "long" segment anything longer than the "medium" standard. When used with unfiltered peaks, and for very unstable signals, where signal noise varies from run to run, this method of relative segment length designation has been to produce more widely useful peak length designations than other methods. Other relative segment length calculation methods also exist and the invention is not dependent on any single length calculation method.

Figure 5:
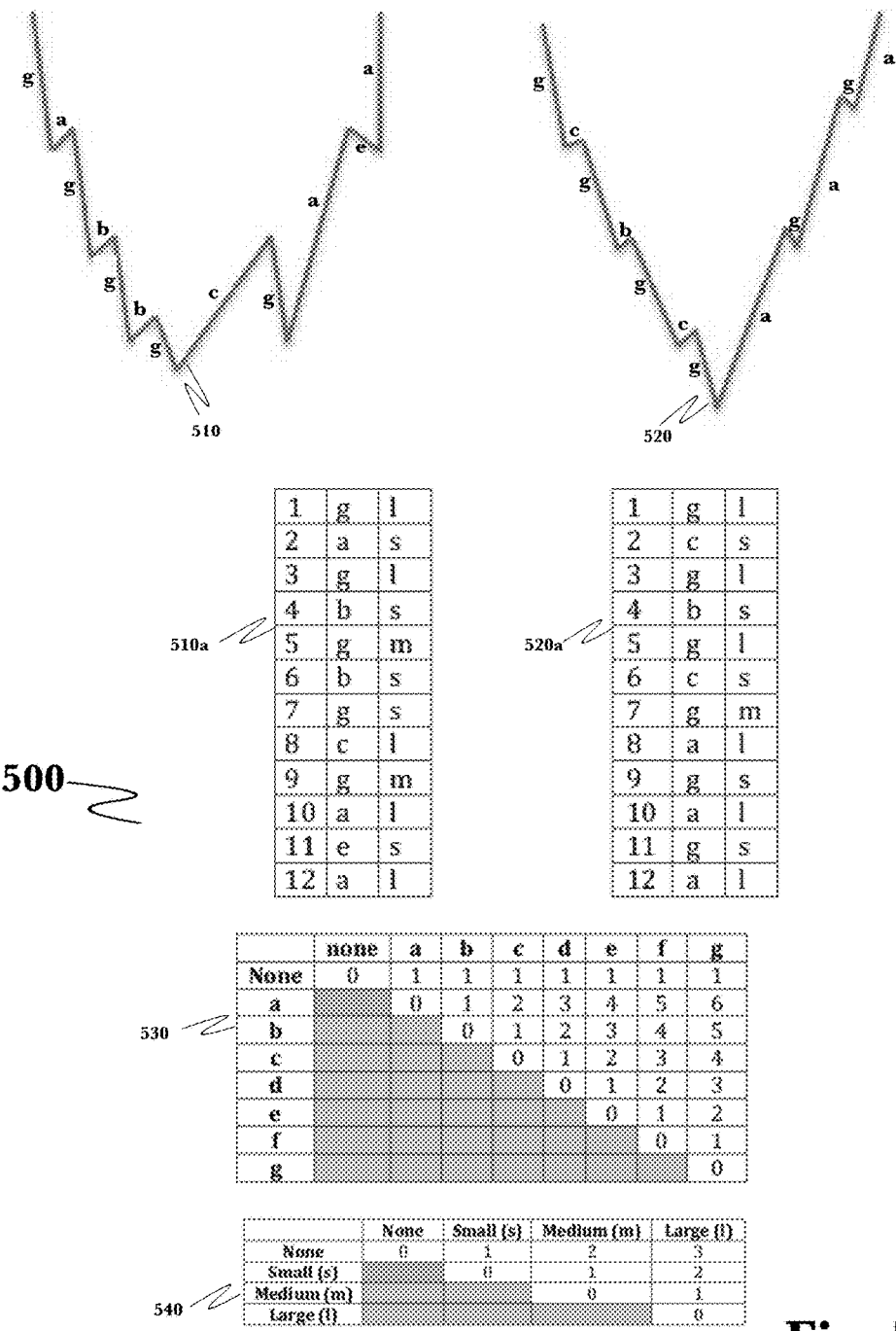
FIG. 5 is a method diagram illustrating how generation of comparison tables from two signal peaks with the same number of segments may be accomplished.

FIG. 5 is a method diagram illustrating generation of comparison tables from two signal peaks with the same number of segments may be accomplished. A major facet of usefulness of qualitative signal analysis is the ability to compare peaks within single signal data samples and across multiple signal data samples during signal processing. An illustrative peak comparison method which uses the angle categorization method and segment length designation method described previously is presented 500. Here two peaks 510 and 520, each having twelve segments are analyzed for segment angle categories using the seven category scoring standard FIG. 2, shown as "a" through "g" on each of the sample peaks 510 and 520 and in tables 510a and 520a which present the data of peaks 510 and 520 respectively. In addition to the angle determination, the relative segment lengths for each segment, 1 through 12, of sample peaks 510 and 520 are also calculated as shown in the third column of tables 510a and 520a where "s" is used to designate short length segments relative to other segments in the peak, "m" is used to designate medium length segments relative to other segments in the peak and "l" used to designate long length segments relative to other segments in the peak. With these two pieces of peak specific data, the tools to allow comparison of the two peaks 510, 520 can be employed. In this embodiment, a scoring matrix for scoring angle category differences in corresponding segments within the two peaks, for example 510a, column #1 segment/row 3 compared to 520a, column #1 segment/row 3 or 510a, column #1 segment/row 7 compared to 520a, column #1 segment/row 7 530 and a scoring matrix for scoring relative segment length differences in corresponding segments within the two peaks, for example 510a, column #1 segment/row 2 compared to 520a, column #1 segment/row 2 or 510a, column #1 segment/row 7 compared to 520a, column #1 segment/row 7, 540 are depicted. In the scoring matrix for angle category, incremental scores are given to increasing differences between angle designations between each segment of the two sample peaks. For example, segment "2" of the peak shown on the left, 510 has an angle category designation of "a" 510a whereas segment "2" of the peak shown on the right, 520 has an angle designation of "c" 520a, using these designations and finding the designation of 510 on the list of row labels 530, row 4, the designation of 520 in the list of column headings 530 column 5, and then following that row and column to their intersection, a score of "2" is retrieved. This can be done for each segment in both peaks and does not depend on the number of angle categories in use, working with modified matrices for four angle categories (example "a", "b", "c", "d" depicted in 330) or two (example "UP", "DOWN") categories. Similarly, for the relative length designations, the length designation matrix 540 can be used to get difference scores for the lengths for each of the peak segments for both of the peaks. For example, looking in table 510a the fifth segment of peak 510 column 1, row 5 has a length designation of medium ("m") whereas the fifth segment of peak 520, table 520a column 1, row 5 has a length designation of long ("l"). Looking at the length score matrix 540, one gets a length difference score of "1". Again embodiments having more of less than three relative length categories work similarly to the three category example described here with only changes in the number of matrix cells needed. These scores, when determined for each segment of both peaks can be used to measure the similarity between the peaks.

The above description is just one possible method of many methods to compare signal peaks, the invention does not rely on any specific method or technique to compare signal peaks and can use different methods dependent on the requirements and specifications of the signal processing process. In particular, the content of the matrix may be constructed in a problem-specific way that is adapted to allow effective qualitative artificial intelligence to be applied in solving a particular problem.

FIG. 6 is a process diagram of how similitude between two peaks with the same number of segments may be calculated 600. An important capability of qualitative signal analysis devices is that the results lend themselves to determination of similarity between two peaks within the same signal processing data sample or even potentially between multiple signal processing samples obtained from same or very similar types of source equipment. Using illustrative qualitative characteristics of peak segment number, individual segment angles within each peak and relative segment length within each peak employed previously, a method for calculation of peak similitude between two peaks by an embodiment of the invention is depicted. This exemplary method, uses comparisons reliant on all segment angle and relative segment length data present for each segment of both analyzed signal peaks. That both peaks to be compared have the same number of segments is tested and confirmed 601. Failure of this test, meaning that the two peaks currently about to be compared have a disparate number of peaks, results in the immediate exit of the test procedure, probably with some alert reporting segment number mismatch 602. Choice of peaks with equal segment numbers for comparison results in the initialization of variables, "diffAngleSum" and "diffSegmentLengthSum" which will hold the difference score totals for both segment angles to be compared and segment relative length data to be compared respectively to "0" 603. The method of the embodiment then repetitively calculates 604 through 607 summed difference scores for angles of each corresponding segment that make up compared peaks 605 using a matrix similar to that depicted in 530 and calculates summed difference scores for relative lengths of each corresponding segment that make up compared peaks 606 using a matrix like that depicted in 540. Analyses employing more of less angle categories or relative length designations are run similarly with different matrices in support of the difference sums. Once all segments in both peaks have been analyzed 607, derivative calculations may be employed 608, for example dividing the angle difference sum stored in "diffAngleSum" by the number of angle categories (7 in this embodiment) and then dividing that number by the number of segments in a peak (12 in this embodiment). Segment length may be normalized by dividing the relative segment length difference sum stored in "diffSegmentLengthSum" by the number of length designations (3 in this embodiment) and then the number of segments in a peak (12 in this embodiment) to normalize the numbers across analyses using different category numbers and peaks with differing numbers of segments. These normalized figures may then be further used to create a qualitative similitude score for compared signal peaks. As an example, the normalized segment angle and segment length results from 608 might be added together to give a total normalized difference score, that difference score then subtracted from 1 and then multiplied by 100 to produce a single, percentage of similitude score for analyzed peak pairs. Of course those knowledgeable in the field could develop many other processes to produce qualitative similitude scores using the presented or additional qualitative signal characteristics, that presented here was for illustrative purposes and uses parameters felt seminal to qualitative signal analysis within the larger signal processing framework, the example should in no way be taken to limit the invention in the use of other similitude measuring methods as the invention can change such methods as the design and requirements of the signal processing effort at hand requires.

FIG. 7 is a method diagram depicting how two signal peaks with different number of segments may be normalized prior to comparison 700. It is quite common that two peaks to be compared have a different number of segments. In this illustration the peak represented in 710 has twelve segments whereas the peak represented in 720 has sixteen segments. As would be expected, the number of segments each peak has does not effect the ability to assign segment angle categories 710a column 2 and 720a, column 2. Likewise, assignment of relative segment length measurements is not affected by the peaks having a disparate number of segments 710a column 3 and 720a, column 3. Special preparation may be needed however, when comparison of peak similitude between two peaks with different segment numbers. Many tactics could be taken in this instance, one embodiment could add extra, "filler" segments to the middle of the segment list of the peak with fewer and then fill the data with the highest derived difference scores to create lower scores of similarity. Another embodiment might randomly remove segments from the peak with the greater number of segments and assess a standard penalizing factor for each segment removed. In the embodiment depicted the two peaks are first qualitatively analyzed for both relative segment lengths and angle categories of each to determine regions of the two peaks with the most similarity while adding extra segments to the peak having the smaller segment number to maximize similarity. This can be thought of as virtually superimposing the two peaks that have been dissected into multiple pieces and visually manipulating the pieces of the peak with a smaller number of segments to maximize similarity, added segment pieces to fill in the gaps 730. The extra segment pieces in this method are given the value of "none" for segment angle and segment length tables and similitude calculations run as per the method depicted in 600. To arrive at a first estimate of similitude (this estimate may, of course, be artificially high, if for example the first and last segments are always the same and if number of the rest of the segments is small, it might be artificially high), the formula to compute the percentage of similitude can contain more qualitative aspects of the signal for a particular application (such as the aspect ratio of each peak) as well as quantitative aspects (to penalize some very different aspect of two peaks).

This method of normalizing and then computing the similitude of two peaks is just one of many that may be used. The invention, while certainly able to employ the described method is not reliant on and the use of this method over others possible in this illustration should not be taken to limit the scope of the invention in any way.

Hardware Architecture

Generally, the techniques disclosed herein may be implemented on hardware or a combination of software and hardware. For example, they may be implemented in an operating system kernel, in a separate user process, in a library package bound into network applications, on a specially constructed machine, on an application-specific integrated circuit (ASIC), or on a network interface card.

Software/hardware hybrid implementations of at least some of the embodiments disclosed herein may be implemented on a programmable network-resident machine (which should be understood to include intermittently connected network-aware machines) selectively activated or reconfigured by a computer program stored in memory. Such network devices may have multiple network interfaces that may be configured or designed to utilize different types of network communication protocols. A general architecture for some of these machines may be described herein in order to illustrate one or more exemplary means by which a given unit of functionality may be implemented. According to specific embodiments, at least some of the features or functionalities of the various embodiments disclosed herein may be implemented on one or more general-purpose computers associated with one or more networks, such as for example an end-user computer system, a client computer, a network server or other server system, a mobile computing device (e.g., tablet computing device, mobile phone, smartphone, laptop, or other appropriate computing device), a consumer electronic device, a music player, or any other suitable electronic device, router, switch, or other suitable device, or any combination thereof. In at least some embodiments, at least some of the features or functionalities of the various embodiments disclosed herein may be implemented in one or more virtualized computing environments (e.g., network computing clouds, virtual machines hosted on one or more physical computing machines, or other appropriate virtual environments).

Referring now to FIG. 8, there is shown a block diagram depicting an exemplary computing device 10 suitable for implementing at least a portion of the features or functionalities disclosed herein. Computing device 10 may be, for example, any one of the computing machines listed in the previous paragraph, or indeed any other electronic device capable of executing software- or hardware-based instructions according to one or more programs stored in memory. Computing device 10 may be configured to communicate with a plurality of other computing devices, such as clients or servers, over communications networks such as a wide area network a metropolitan area network, a local area network, a wireless network, the Internet, or any other network, using known protocols for such communication, whether wireless or wired.

In one embodiment, computing device 10 includes one or more central processing units (CPU) 12, one or more interfaces 15, and one or more busses 14 (such as a peripheral component interconnect (PCI) bus). When acting under the control of appropriate software or firmware, CPU 12 may be responsible for implementing specific functions associated with the functions of a specifically configured computing device or machine. For example, in at least one embodiment, a computing device 10 may be configured or designed to function as a server system utilizing CPU 12, local memory 11 and/or remote memory 16, and interface(s) 15. In at least one embodiment, CPU 12 may be caused to perform one or more of the different types of functions and/or operations under the control of software modules or components, which for example, may include an operating system and any appropriate applications software, drivers, and the like.

CPU 12 may include one or more processors 13 such as, for example, a processor from one of the Intel, ARM, Qualcomm, and AMD families of microprocessors. In some embodiments, processors 13 may include specially designed hardware such as application-specific integrated circuits (ASICs), electrically erasable programmable read-only memories (EEPROMs), field-programmable gate arrays (FPGAs), and so forth, for controlling operations of computing device 10. In a specific embodiment, a local memory 11 (such as non-volatile random access memory (RAM) and/or read-only memory (ROM), including for example one or more levels of cached memory) may also form part of CPU 12. However, there are many different ways in which memory may be coupled to system 10. Memory 11 may be used for a variety of purposes such as, for example, caching and/or storing data, programming instructions, and the like. It should be further appreciated that CPU 12 may be one of a variety of system-on-a-chip (SOC) type hardware that may include additional hardware such as memory or graphics processing chips, such as a Qualcomm SNAPDRAGON™ or Samsung EXYNOS™ CPU as are becoming increasingly common in the art, such as for use in mobile devices or integrated devices.

As used herein, the term "processor" is not limited merely to those integrated circuits referred to in the art as a processor, a mobile processor, or a microprocessor, but broadly refers to a microcontroller, a microcomputer, a programmable logic controller, an application-specific integrated circuit, and any other programmable circuit.

In one embodiment, interfaces 15 are provided as network interface cards (NICs). Generally, NICs control the sending and receiving of data packets over a computer network; other types of interfaces 15 may for example support other peripherals used with computing device 10. Among the interfaces that may be provided are Ethernet interfaces, frame relay interfaces, cable interfaces, DSL interfaces, token ring interfaces, graphics interfaces, and the like. In addition, various types of interfaces may be provided such as, for example, universal serial bus (USB), Serial, Ethernet, FIREWIRE™, THUNDERBOLT™, PCI, parallel, radio frequency (RF), BLUETOOTH™, near-field communications (e.g., using near-field magnetics), 802.11 (WiFi), frame relay, TCP/IP, ISDN, fast Ethernet interfaces, Gigabit Ethernet interfaces, Serial ATA (SATA) or external SATA (ESATA) interfaces, high-definition multimedia interface (HDMI), digital visual interface (DVI), analog or digital audio interfaces, asynchronous transfer mode (ATM) interfaces, high-speed serial interface (HSSI) interfaces, Point of Sale (POS) interfaces, fiber data distributed interfaces (FDDIs), and the like. Generally, such interfaces 15 may include physical ports appropriate for communication with appropriate media. In some cases, they may also include an independent processor (such as a dedicated audio or video processor, as is common in the art for high-fidelity A/V hardware interfaces) and, in some instances, volatile and/or non-volatile memory (e.g., RAM).

Although the system shown and described above illustrates one specific architecture for a computing device 10 for implementing one or more of the inventions described herein, it is by no means the only device architecture on which at least a portion of the features and techniques described herein may be implemented. For example, architectures having one or any number of processors 13 may be used, and such processors 13 may be present in a single device or distributed among any number of devices. In one embodiment, a single processor 13 handles communications as well as routing computations, while in other embodiments a separate dedicated communications processor may be provided. In various embodiments, different types of features or functionalities may be implemented in a system according to the invention that includes a client device (such as a tablet device or smartphone running client software) and server systems (such as a server system described in more detail below).

Regardless of network device configuration, the system of the present invention may employ one or more memories or memory modules (such as, for example, remote memory block 16 and local memory 11) configured to store data, program instructions for the general-purpose network operations, or other information relating to the functionality of the embodiments described herein (or any combinations of the above). Program instructions may control execution of or comprise an operating system and/or one or more applications, for example. Memory 16 or memories 11, 16 may also be configured to store data structures, configuration data, encryption data, historical system operations information, or any other specific or generic non-program information described herein.

Because such information and program instructions may be employed to implement one or more systems or methods described herein, at least some network device embodiments may include nontransitory machine-readable storage media, which, for example, may be configured or designed to store program instructions, state information, and the like for performing various operations described herein. Examples of such nontransitory machine-readable storage media include, but are not limited to, magnetic media such as hard disks, floppy disks, and magnetic tape; optical media such as CD-ROM disks; magneto-optical media such as optical disks, and hardware devices that are specially configured to store and perform program instructions, such as read-only memory devices (ROM), flash memory (as is common in mobile devices and integrated systems), solid state drives (SSD) and "hybrid SSD" storage drives that may combine physical components of solid state and hard disk drives in a single hardware device (as are becoming increasingly common in the art with regard to personal computers), memristor memory, random access memory (RAM), and the like. It should be appreciated that such storage means may be integral and non-removable (such as RAM hardware modules that may be soldered onto a motherboard or otherwise integrated into an electronic device), or they may be removable such as swappable flash memory modules (such as "thumb drives" or other removable media designed for rapidly exchanging physical storage devices), "hot-swappable" hard disk drives or solid state drives, removable optical storage discs, or other such removable media, and that such integral and removable storage media may be utilized interchangeably. Examples of program instructions include both object code, such as may be produced by a compiler, machine code, such as may be produced by an assembler or a linker, byte code, such as may be generated by for example a JAVA™ compiler and may be executed using a Java virtual machine or equivalent, or files containing higher level code that may be executed by the computer using an interpreter (for example, scripts written in Python, Perl, Ruby, Groovy, or any other scripting language).

Figure 9:
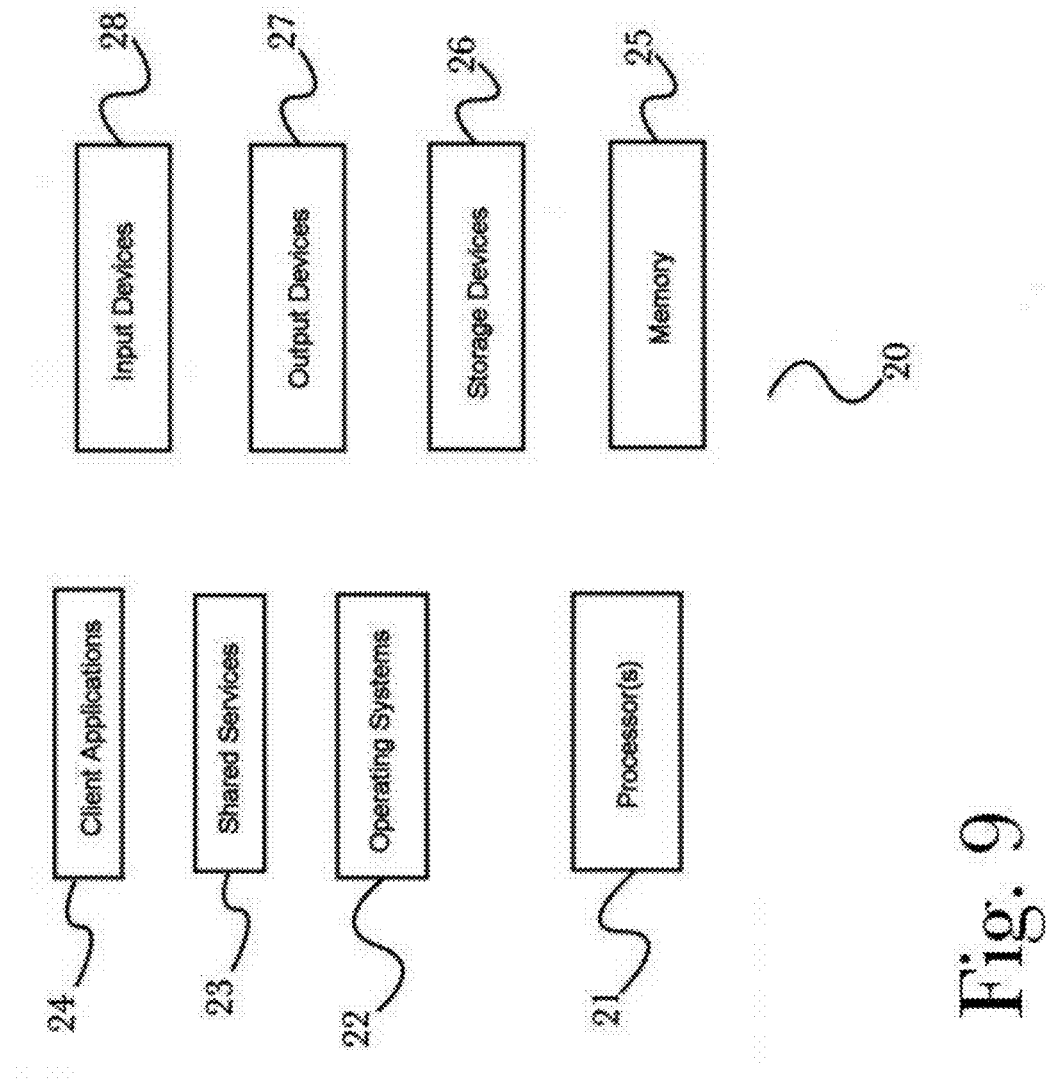
FIG. 9 is a block diagram illustrating an exemplary logical architecture for a client device, according to an embodiment of the invention.

In some embodiments, systems according to the present invention may be implemented on a standalone computing system. Referring now to FIG. 9, there is shown a block diagram depicting a typical exemplary architecture of one or more embodiments or components thereof on a standalone computing system. Computing device 20 includes processors 21 that may run software that carry out one or more functions or applications of embodiments of the invention, such as for example a client application 24. Processors 21 may carry out computing instructions under control of an operating system 22 such as, for example, a version of Microsoft's WINDOWS™ operating system, Apple's Mac OS/X or iOS operating systems, some variety of the Linux operating system, Google's ANDROID™ operating system, or the like. In many cases, one or more shared services 23 may be operable in system 20, and may be useful for providing common services to client applications 24. Services 23 may for example be WINDOWS™ services, userspace common services in a Linux environment, or any other type of common service architecture used with operating system 21. Input devices 28 may be of any type suitable for receiving user input, including for example a keyboard, touchscreen, microphone (for example, for voice input), mouse, touchpad, trackball, or any combination thereof. Output devices 27 may be of any type suitable for providing output to one or more users, whether remote or local to system 20, and may include for example one or more screens for visual output, speakers, printers, or any combination thereof. Memory 25 may be random-access memory having any structure and architecture known in the art, for use by processors 21, for example to run software. Storage devices 26 may be any magnetic, optical, mechanical, memristor, or electrical storage device for storage of data in digital form (such as those described above). Examples of storage devices 26 include flash memory, magnetic hard drive, CD-ROM, and/or the like.

Figure 10:
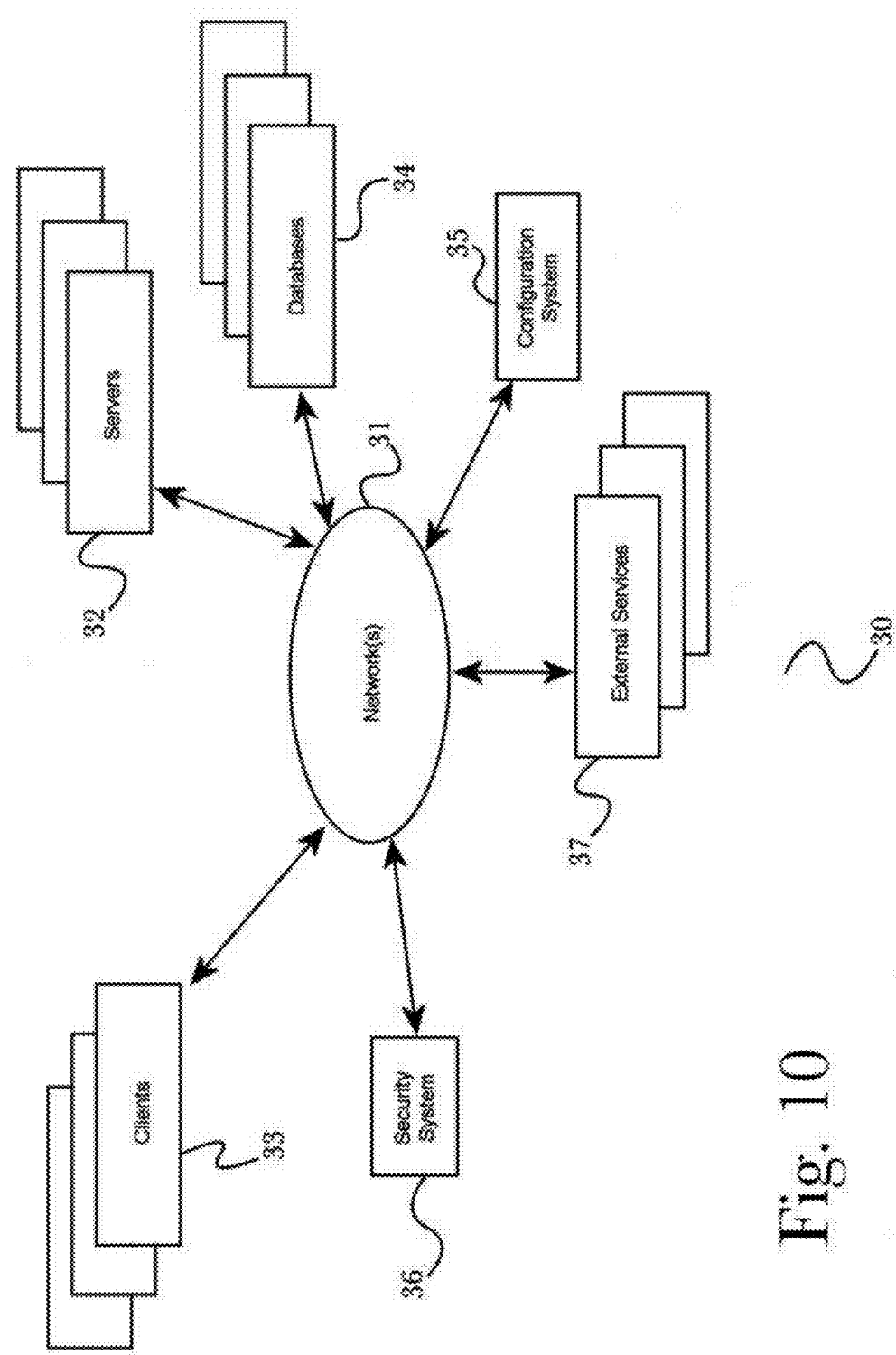
FIG. 10 is a block diagram showing an exemplary architectural arrangement of clients, servers, and external services, according to an embodiment of the invention.

In some embodiments, systems of the present invention may be implemented on a distributed computing network, such as one having any number of clients and/or servers. Referring now to FIG. 10, there is shown a block diagram depicting an exemplary architecture 30 for implementing at least a portion of a system according to an embodiment of the invention on a distributed computing network. According to the embodiment, any number of clients 33 may be provided. Each client 33 may run software for implementing client-side portions of the present invention; clients may comprise a system 20 such as that illustrated above. In addition, any number of servers 32 may be provided for handling requests received from one or more clients 33. Clients 33 and servers 32 may communicate with one another via one or more electronic networks 31, which may be in various embodiments any of the Internet, a wide area network, a mobile telephony network (such as CDMA or GSM cellular networks), a wireless network (such as WiFi, Wimax, LTE, and so forth), or a local area network (or indeed any network topology known in the art; the invention does not prefer any one network topology over any other). Networks 31 may be implemented using any known network protocols, including for example wired and/or wireless protocols.

In addition, in some embodiments, servers 32 may call external services 37 when needed to obtain additional information, or to refer to additional data concerning a particular call. Communications with external services 37 may take place, for example, via one or more networks 31. In various embodiments, external services 37 may comprise web-enabled services or functionality related to or installed on the hardware device itself. For example, in an embodiment where client applications 24 are implemented on a smartphone or other electronic device, client applications 24 may obtain information stored in a server system 32 in the cloud or on an external service 37 deployed on one or more of a particular enterprise's or user's premises.

In some embodiments of the invention, clients 33 or servers 32 (or both) may make use of one or more specialized services or appliances that may be deployed locally or remotely across one or more networks 31. For example, one or more databases 34 may be used or referred to by one or more embodiments of the invention. It should be understood by one having ordinary skill in the art that databases 34 may be arranged in a wide variety of architectures and using a wide variety of data access and manipulation means. For example, in various embodiments one or more databases 34 may comprise a relational database system using a structured query language (SQL), while others may comprise an alternative data storage technology such as those referred to in the art as "NoSQL" (for example, Hadoop Cassandra, Google BigTable, and so forth). In some embodiments, variant database architectures such as column-oriented databases, in-memory databases, clustered databases, distributed databases, or even flat file data repositories may be used according to the invention. It will be appreciated by one having ordinary skill in the art that any combination of known or future database technologies may be used as appropriate, unless a specific database technology or a specific arrangement of components is specified for a particular embodiment herein. Moreover, it should be appreciated that the term "database" as used herein may refer to a physical database machine, a cluster of machines acting as a single database system, or a logical database within an overall database management system. Unless a specific meaning is specified for a given use of the term "database", it should be construed to mean any of these senses of the word, all of which are understood as a plain meaning of the term "database" by those having ordinary skill in the art.

Similarly, most embodiments of the invention may make use of one or more security systems 36 and configuration systems 35. Security and configuration management are common information technology (IT) and web functions, and some amount of each are generally associated with any IT or web systems. It should be understood by one having ordinary skill in the art that any configuration or security subsystems known in the art now or in the future may be used in conjunction with embodiments of the invention without limitation, unless a specific security 36 or configuration system 35 or approach is specifically required by the description of any specific embodiment.

Figure 11:
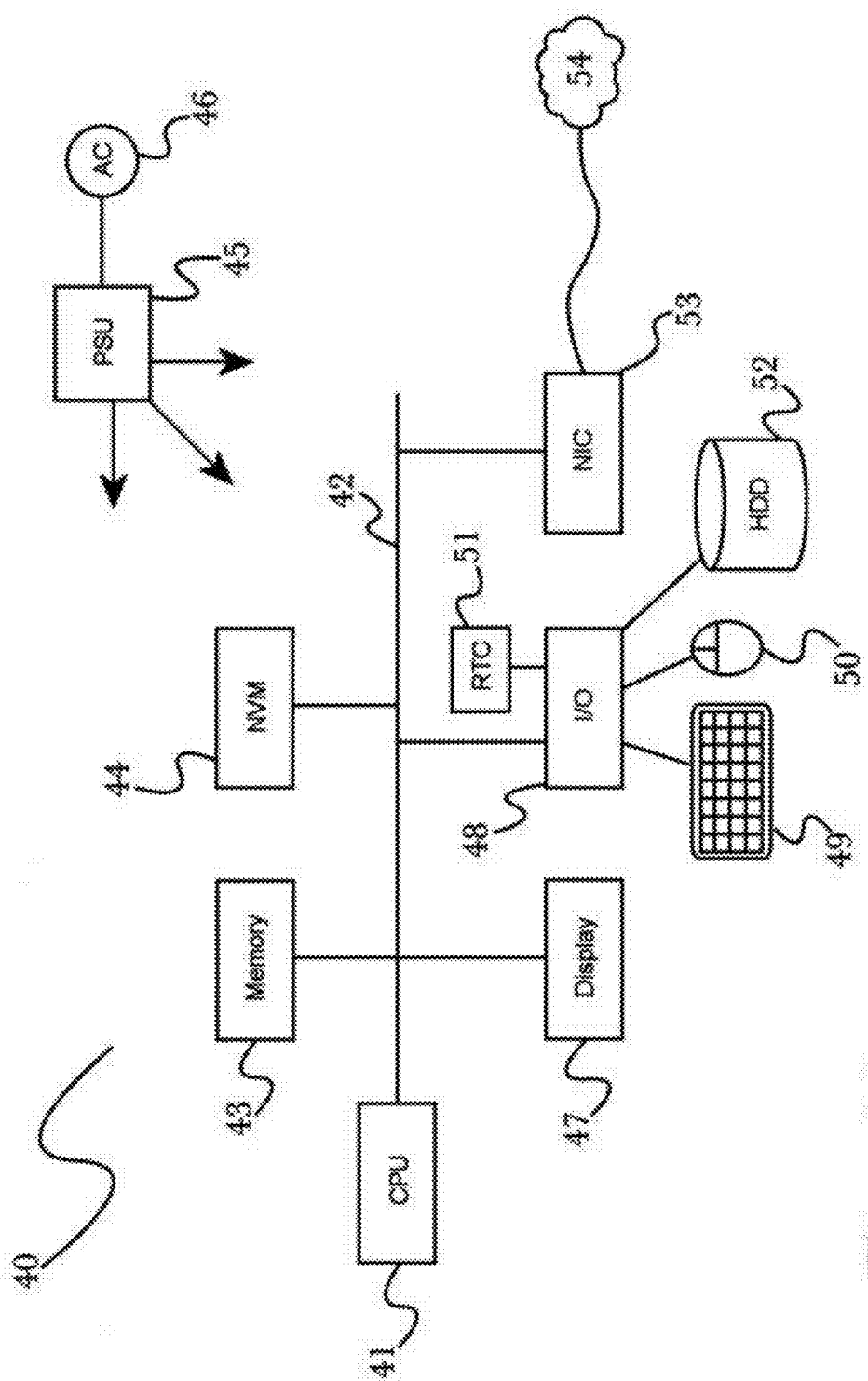
FIG. 11 is another block diagram illustrating an exemplary hardware architecture of a computing device used in various embodiments of the invention.

FIG. 11 shows an exemplary overview of a computer system 40 as may be used in any of the various locations throughout the system. It is exemplary of any computer that may execute code to process data. Various modifications and changes may be made to computer system 40 without departing from the broader scope of the system and method disclosed herein. Central processor unit (CPU) 41 is connected to bus 42, to which bus is also connected memory 43, nonvolatile memory 44, display 47, input/output (I/O) unit 48, and network interface card (NIC) 53. I/O unit 48 may, typically, be connected to keyboard 49, pointing device 50, hard disk 52, and real-time clock 51. NIC 53 connects to network 54, which may be the Internet or a local network, which local network may or may not have connections to the Internet. Also shown as part of system 40 is power supply unit 45 connected, in this example, to a main alternating current (AC) supply 46. Not shown are batteries that could be present, and many other devices and modifications that are well known but are not applicable to the specific novel functions of the current system and method disclosed herein. It should be appreciated that some or all components illustrated may be combined, such as in various integrated applications, for example Qualcomm or Samsung system-on-a-chip (SOC) devices, or whenever it may be appropriate to combine multiple capabilities or functions into a single hardware device (for instance, in mobile devices such as smartphones, video game consoles, in-vehicle computer systems such as navigation or multimedia systems in automobiles, or other integrated hardware devices).

In various embodiments, functionality for implementing systems or methods of the present invention may be distributed among any number of client and/or server components. For example, various software modules may be implemented for performing various functions in connection with the present invention, and such modules may be variously implemented to run on server and/or client The skilled person will be aware of a range of possible modifications of the various embodiments described above. Accordingly, the present invention is defined by the claims and their equivalents.

What is claimed is:

1. A computer-implemented method comprising:
receiving, by a qualitative signal analysis module of a system that includes (i) the qualitative signal analysis module, (ii) an output processing module, and (iii) a signal processing or display device, a signal;
generating, by the qualitative signal analysis module, a two-dimensional representation of the signal, the two-dimensional representation including (i) a sequence of consecutive peaks that each represent a local minimum point or a local maximum point within the two-dimensional representation of the signal, and (ii) a respective line segment that connects each pair of adjacent peaks;
for each line segment that connects each respective pair of adjacent peaks, generating, by the qualitative signal analysis module, a label for the line segment based at least on classifying the line segment according to one or more qualitative criteria;
generating, by the output processor module, a qualitative representation of the signal based on the labels that were generated for the line segment of the two-dimensional representation of the signal; and
providing, by the output processing module, the qualitative representation of the signal for processing by the signal processing or display device.

2. The method of claim 1, wherein classifying the line segment according to one or more qualitative criteria comprises:
determining an angle, in the two dimensional representation, between the pair of adjacent peaks connected by the line segment; and
outputting a particular label that is pre-associated with the angle, or with a range of angles that includes the angle.

3. The method of claim 1, wherein classifying the line segment according to one or more qualitative criteria comprises:
determining a value that represents a length, in the two dimensional representation, of the line segment; and
outputting a particular label that is pre-associated with the value that represents the length, or with a range of lengths that includes the length.

4. The method of claim 3, wherein classifying the line segment according to one or more qualitative criteria comprises:
determining an angle, in the two dimensional representation, between the pair of adjacent peaks connected by the line segment; and
outputting a different, particular label that is pre-associated with the angle, or with a range of angles that includes the angle.

5. The method of claim 4, wherein classifying the line segment according to one or more qualitative criteria comprises:
determining a third label based at least on (i) the particular label that is pre-associated with the value that represents the length, or with the range of lengths that includes the length, and (ii) the different, particular label that is pre-associated with the angle, or with the range of angles that includes the angle.

6. The method of claim 1, comprising:
providing, by the output processing module, a different qualitative representation of a different signal for comparison with the qualitative representation of the signal by the signal processing or display device.

7. The method of claim 6, comprising:
performing, by the signal processing or display device, a determination of similarity between the different qualitative representation of the different signal and the qualitative representation of the signal.

8. The method of claim 7, wherein performing a determination of similarity comprises introducing one or more extra segments to a middle of a segment list, or removing one or more segments.

9. The method of claim 7, wherein performing a determination of similarity comprises comparing segment lists corresponding to the qualitative representations of the signal and different signal and introducing one or more segments to a middle of a segment list, or removing one or more segments from a segment list, to facilitate the comparison.

10. A system comprising:
one or more computers; and one or more computers and one or more storage devices storing instructions that are operable, when executed by the one or more computers, to cause the one or more computers to perform operations comprising:

receiving, by a qualitative signal analysis module of a system that includes (i) the qualitative signal analysis module, (ii) an output processing module, and (iii) a signal processing or display device, a signal;

generating, by the qualitative signal analysis module, a two-dimensional representation of the signal, the two-dimensional representation including (i) a sequence of consecutive peaks that each represent a local minimum point or a local maximum point within the two-dimensional representation of the signal, and (ii) a respective line segment that connects each pair of adjacent peaks;

for each line segment that connects each respective pair of adjacent peaks, generating, by the qualitative signal analysis module, a label for the line segment based at least on classifying the line segment according to one or more qualitative criteria;

generating, by the output processor module, a qualitative representation of the signal based on the labels that were generated for the line segment of the two-dimensional representation of the signal; and providing, by the output processing module, the qualitative representation of the signal for processing by the signal processing or display device.

11. The system of claim 10, wherein classifying the line segment according to one or more qualitative criteria comprises:

determining an angle, in the two dimensional representation, between the pair of adjacent peaks connected by the line segment; and outputting a particular label that is pre-associated with the angle, or with a range of angles that includes the angle.

12. The system of claim 10, wherein classifying the line segment according to one or more qualitative criteria comprises:

determining a value that represents a length, in the two dimensional representation, of the line segment; and outputting a particular label that is pre-associated with the value that represents the length, or with a range of lengths that includes the length.

13. The system of claim 12, wherein classifying the line segment according to one or more qualitative criteria comprises:

determining an angle, in the two dimensional representation, between the pair of adjacent peaks connected by the line segment; and outputting a different, particular label that is pre-associated with the angle, or with a range of angles that includes the angle.

14. The system of claim 13, wherein classifying the line segment according to one or more qualitative criteria comprises:

determining a third label based at least on (i) the particular label that is pre-associated with the value that represents the length, or with the range of lengths that includes the length, and (ii) the different, particular label that is pre-associated with the angle, or with the range of angles that includes the angle.

15. The system of claim 10, wherein the operations comprise:

providing, by the output processing module, a different qualitative representation of a different signal for comparison with the qualitative representation of the signal by the signal processing or display device.

16. The system of claim 15, wherein the operations comprise:

performing, by the signal processing or display device, a determination of similarity between the different qualitative representation of the different signal and the qualitative representation of the signal.

17. The system of claim 16, wherein performing a determination of similarity comprises introducing one or more extra segments to a middle of a segment list, or removing one or more segments.

18. The method of claim 16, wherein performing a determination of similarity comprises comparing segment lists corresponding to the qualitative representations of the signal and different signal and introducing one or more segments to a middle of a segment list, or removing one or more segments from a segment list, to facilitate the comparison.

19. A non-transitory computer-readable medium storing software comprising instructions executable by one or more computers which, upon such execution, cause the one or more computers to perform operations comprising:

receiving, by a qualitative signal analysis module of a system that includes (i) the qualitative signal analysis module, (ii) an output processing module, and (iii) a signal processing or display device, a signal;

generating, by the qualitative signal analysis module, a two-dimensional representation of the signal, the two-dimensional representation including (i) a sequence of consecutive peaks that each represent a local minimum point or a local maximum point within the two-dimensional representation of the signal, and (ii) a respective line segment that connects each pair of adjacent peaks;

for each line segment that connects each respective pair of adjacent peaks, generating, by the qualitative signal analysis module, a label for the line segment based at least on classifying the line segment according to one or more qualitative criteria;

generating, by the output processor module, a qualitative representation of the signal based on the labels that were generated for the line segment of the two-dimensional representation of the signal; and providing, by the output processing module, the qualitative representation of the signal for processing by the signal processing or display device.

20. The medium of claim 19, wherein classifying the line segment according to one or more qualitative criteria comprises:

determining an angle, in the two dimensional representation, between the pair of adjacent peaks connected by the line segment; and outputting a particular label that is pre-associated with the angle, or with a range of angles that includes the angle.

* * * * *

UNITED STATES PATENT AND TRADEMARK OFFICE
CERTIFICATE OF CORRECTION

PATENT NO. : 10,338,197 B2
APPLICATION NO. : 15/141818
DATED : July 2, 2019
INVENTOR(S) : Maria Teresa Escrig Monferrer It is certified that error appears in the above-identified patent and that said Letters Patent is hereby corrected as shown below:

On the Title Page

Column 2 (item (57) Abstract), Line 5, delete "processor" and insert -- processor, --, therefor.

In the Claims

Column 20, In Claim 18, Line 18, delete "method" and insert -- system --, therefor.

Signed and Sealed this
Tenth Day of September, 2019

Andrei Iancu
*Director of the United States Patent and Trademark Office*